Jan. 19, 1965 K. HUBNER 3,166,448

METHOD FOR PRODUCING RIB TRANSISTOR

Filed April 7, 1961 2 Sheets-Sheet 1

KURT HUBNER
*INVENTOR.*

*BY* Flehr and Swain
ATTORNEYS

Jan. 19, 1965 K. HUBNER 3,166,448

METHOD FOR PRODUCING RIB TRANSISTOR

Filed April 7, 1961 2 Sheets-Sheet 2

KURT HUBNER

*INVENTOR.*

*BY*

Flehr and Swain

ATTORNEYS

United States Patent Office 3,166,448

Patented Jan. 19, 1965

3,166,448

METHOD FOR PRODUCING RIB TRANSISTOR

Kurt Hubner, Palo Alto, Calif., assignor to Clevite Corporation, Cleveland, Ohio, a corporation of Ohio Filed Apr. 7, 1961, Ser. No. 101,437
6 Claims. (Cl. 148—177)

This invention relates generally to high power transistors and more particularly to a rib transistor.

In copending application Serial No. 605,646, filed August 22, 1956, there is described a transistor which includes a base region having relatively low resistance rib regions and high resistance web regions. The web regions essentially serve to establish the characteristics of the device, while the rib regions ensure that a substantial portion of the region operates. Transistors of this type are suited for high frequency, high power operation.

It is a general object of the present invention to provide an improved method of making a rib transistor.

It is another object of the present invention to provide a method of making a rib transistor which does not have any critical masking steps.

It is another object of the present invention to provide an improved method for making ohmic contact to base and emitter regions of a rib transistor.

It is still another object of the present invention to provide a rib transistor in which the emitter structure consists of an array of diffused emitter stripes formed in a base region and in which contact is made to the emitter and base regions by employing tabs which form ohmic contact with one region and rectifying contacts with the other region whereby the emitter and base contacts are selectively made.

In accordance with the present invention, an emitter structure comprising an array of emitter stripes is diffused into a base layer. Contact is made to the base and emitter regions by tabs, either metallic or semiconductive, which extend over the entire surface. The tabs making ohmic contact with the emitter stripes form a rectifying junction with the base region and the tabs forming ohmic contact with the base region form a rectifying junction with the emitter stripes.

These and other objects of the invention will be more clearly apparent from the following description when taken in conjunction with the companying drawings.

Referring to the drawing.

Figure 1:
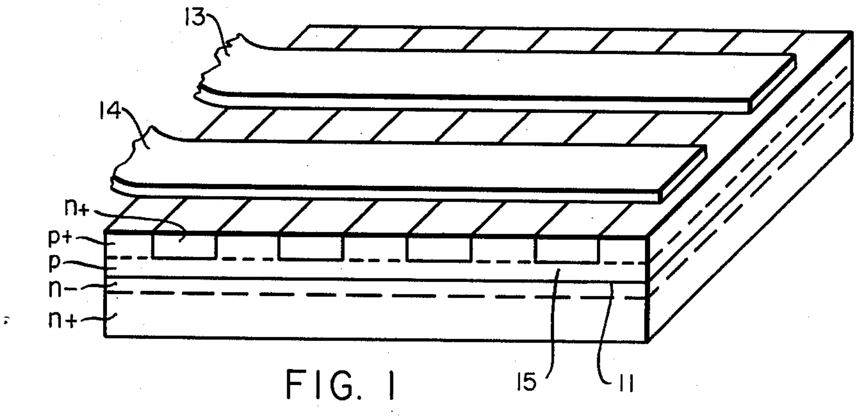
FIGURE 1 is a perspective view showing a rib transistor in accordance with the invention.

The transistor shown in FIGURE 1 includes an n-type region of semiconductive material having first and second portions of different impurity concentration. The first portion has a relatively hight impurity concentration designated n+. The second portion has a relatively low impurity concentration designated n—. A p-type base region of semiconductive material forms a collector junction 11 with the n-type region. The base region includes a portion adjacent the junction which has a relatively low impurity concentration designated p, and a portion away from the junction which has a relatively high impurity concentration designated p+. The device includes an array of n+. The device includes an array of n+ emitter stripes inset by diffusion into the base region whereby their upper surface is in common with the upper surface of the base region. The stripes are deep enough to extend into the lower impurity concentration portion of the base region. Stripes may be formed by masking the device by well known techniques and diffusing impurities in the wafer.

Metallic tabs 13 and 14 are shown providing electrical connection to the emitter array and to the base region. The tab 13 may, for example, comprise aluminum coated Kovar. The tab is applied by alloying the aluminum into the semiconductive material. The aluminum will make ohmic contact to the p+ type base layer and form an alloyed n-p junction with the emitter stripes. The n-p junctions formed with the emitter stripes will have a high enough back voltage so that they can stand the emitter voltage. As a result, ohmic contact is made with the base region, while the contact is isolated from the emitter region or stripes by the n-p junction. To form the emitter contact 14, Kovar coated with a gold-antimony alloy is applied by alloying the gold-antimony into the semiconductive material. The alloying process serves to form a p-n junction with the underlying p-type base region while forming ohmic contact with the emitter region. The contact is isolated from the base region by the p-n junction.

It is observed that even though one emitter strip may short another, there is no deterioration of the operating characteristics of the device. It is further noted that the same diffusion process and the same wafer can be used for different power ratings by cutting up the wafer into pieces of desired area.

Figure 2:
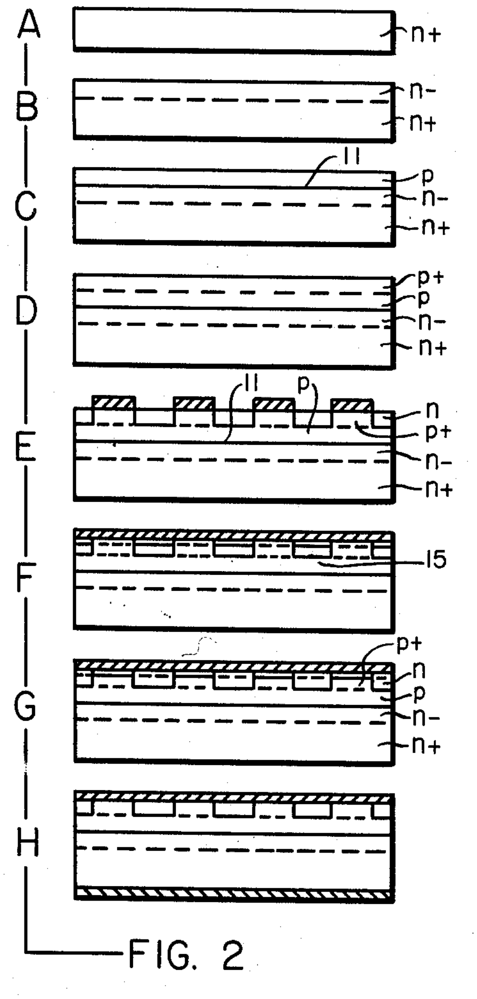
FIGURE 2 shows the steps in forming a rib transistor of the type shown in FIGURE 1.

Referring to FIGURE 2, the steps in forming a semiconductive device structure of the type shown in FIGURE 1 are illustrated. In FIGURE 2A, a portion of a larger wafer of n+ type semiconductive material is shown. The wafer is subjected to an epitaxial growth of an upper n-type layer as illustrated in FIGURE 2B to form a portion of lower impurity concentration. A subsequent epitaxial growth of a p-type layer forms the collector junction 11 previously described. In FIGURE 2D is shown an additional epitaxial growth to form a p+ in the p-type layer.

The upper surface of the wafer may then be suitably masked as, for example, by forming an oxide coating and selectively removing the oxide to leave exposed stripes. Other known masking techniques may also be employed. The masked wafer is then subjected to a diffusion of n-type impurities to form the n-type emitter stripes.

In FIGURE 2F, there is shown the steps of alloying the aluminum coated Kovar tabs to thereby form a rectifying junction with the emitter and an ohmic contact with the base region. It is observed that because of the p+ ribs extending uwardly and in contact with the tab, there is a relatively low resistance path to the operating web portions 15 illustrated in FIGURES 1 and 2F.

FIGURE 2G shows the steps in forming the emitter contact with a gold-antimony coated kovar tab which is alloyed into the surface of the wafer to form a rectifying junction with the base p-type layer an ohmic contact to the emitter stripes. In FIGURE 2H, there is shown the additional step of providing an ohmic collector contact to the base region.

It is, of course, apparent that the Kovar tabs may be coated with other metals or alloys capable of selectively forming by alloying ohmic contact with a region of one conductivity type and rectifying contact with a region of opposite conductivity type.

Figure 3:
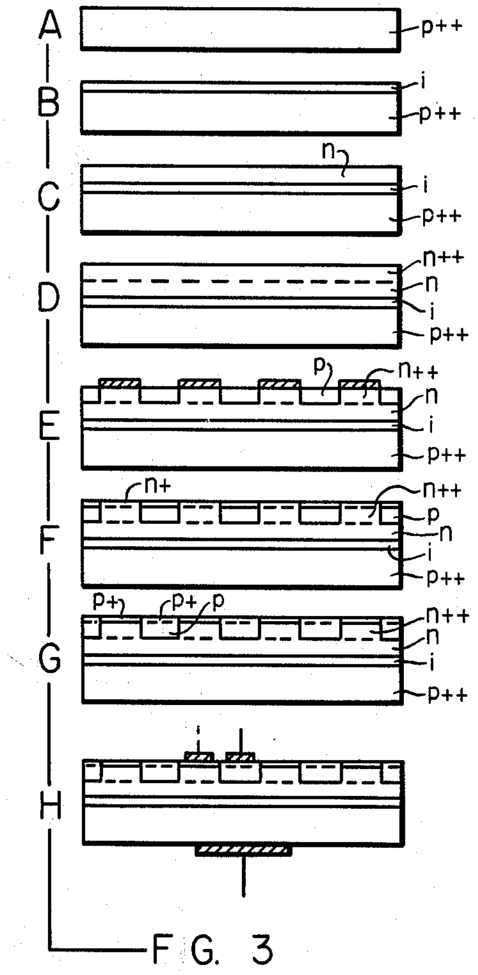
FIGURE 3 shows the steps in forming a high frequency transistor having a minimum collector capacitance.

Referring to FIGURE 3, there is shown a portion of a wafer of high inpurity p-type semiconductive material, designated p++. An upper intrinsic layer is formed by an epitaxial growth, FIGURE 3B. Subsequently, an n-type layer is formed on the upper surface of the device over the intrinsic layer. The n-type layer illustrated is formed by epitaxially growing the same. The device has a structure which is essentially n-i-p++. An upper n-type layer is then formed by an epitaxial growth. The layer has a high impurity concentration, designated n++, FIGURE 3D.

As in the method described with reference to FIGURE 2, the wafer is then suitably masked. A diffusion of p-type impurities is carried out to form a plurality of p-type inset ribs which extend from the upper surface inwardly and define a surface in common with the n++ layer. The wafer is then cleaned to remove the oxide formed in the diffusion operation, and the mask.

A new mask is formed exposing stripes which form an angle with the ribs. As additional diffusion is carried out in the presence of n-type impurities to form an n+ strip which extends across the device, FIGURE 3F. The n+ strip will form ohmic connection to the n++ region and a rectifying junction with the p-type region to thereby provide means making ohmic connection to the n-type base layer. A subsequent masking and diffusion of a stripe of p-type impurities will form the ohmic connection for the emitter strips and a rectifying junction with the adjacent base layer, FIGURE 3G. Subsequently, suitable ohmic contact may be made to the p-type and n-type contact strips and to the collector region as shown in FIGURE 3H. The device shown in FIGURE 3H is a high frequency transistor in which the collector capacitance is minimized by the wide junction region formed by the intrinsic layer. The device has a relatively thin base operating region.

Figure 4:
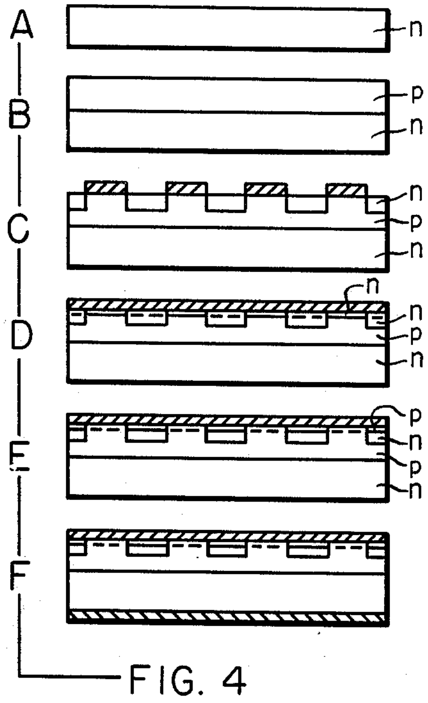
FIGURE 4 shows the steps in forming another rib transistor.

Referring to FIGURE 4, the steps in forming a conventional n-p-n transistor are shown with the exception that the transistor is of the high power, high frequency type including a plurality of emitter strips. In FIGURE 4A, a section of a wafer of semiconductive material is illustrated. The wafer may then be subjected to a diffusion operation to form a p-n junction as illustrated in FIGURE 4B. Subsequent masking and an additional diffusion of n-type impurities will form the inset n-type emitter strips, FIGURE 4C. Cleaning of the wafer and subsequent application of contact tabs will form the necessary ohmic connection to the various regions, FIGURES 4D and 4E. Thus, in FIGURE 4D, a gold antimony coated Kovar tab is alloyed across the upper surface and will form ohmic contact with the emitter strips and a rectifying junction with the p-type base region. The next step is to alloy a Kovar tab which is coated with aluminum and which, in the alloying process, will form a rectifying junction with the emitter strips and an ohmic connection to the base region. In FIGURE 4F, there is illustrated the final step of applying an ohmic contact to the collector region.

Thus, a rib type device having ohmic connection with the various regions is easily formed. It is, of course, understood that devices suitable for handling various powers can be made from the wafer by cutting a suitable dice from the wafer.

Figure 5:
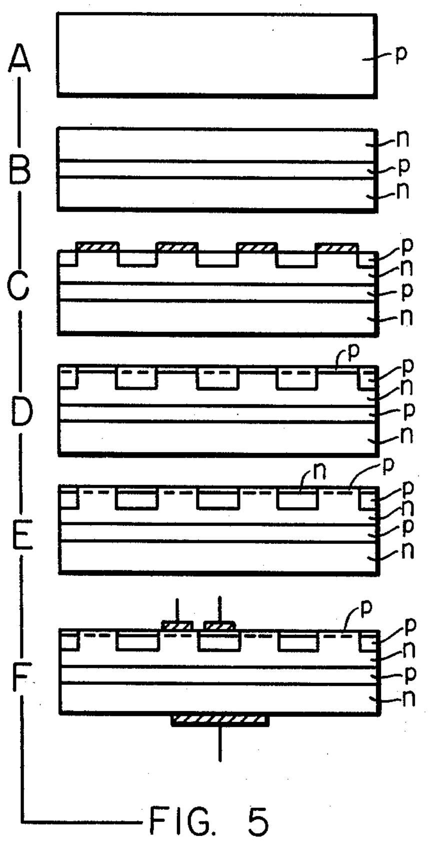
FIGURE 5 shows the steps in forming a four-layer three-terminal controlled rectifier in accordance with the present invention.

Referring to FIGURES 5A–F, the steps in forming a four-layer three-terminal switching device or controlled rectifier are illustrated. In FIGURE 5A, a section of a p-type wafer is shown. The p-type wafer may then be subjected to an n-type diffusion to form upper and lower layers of n-type material to form first and second p-n junctions, FIGURE 5B. A masking operation and a subsequent diffusion of p-type impurities is illustrated in FIGURE 5C and serves to form a plurality of inset emitter strips in one of the n-type layers. Suitable contacts may be formed by diffusion operations similar to those described with reference to the process of FIGURE 3, or by alloying as described in FIGURES 2 and 4. Electrical connection may be made with the n- and p-type diffused contact strips or the tabs and to the lower n-type region. In operation, the outer terminals are connected to the signal to be switched and the base terminal to a control signal.

The concept of selectively making ohmic contact with a region of one conductivity type while making a rectifying contact with a region of opposite conductivity type may also be employed for making ohmic connection to the emitter and base regions of a transistor in which the base and emitter regions extend to a common surface.

I claim:

1. The method of manufacturing a semiconductor device which includes the steps of forming on one face of a semiconductor wafer, which has at least a zone of one conductivity type, a plurality of regions of opposite conductivity type and forming on said one face a contact strip of the same conductivity type as said plurality of regions to provide ohmic contact with said plurality of regions and rectifying contact with said zone.

2. The method as in claim 1 wherein the contact region is formed by diffusion into said one face.

3. The method as in claim 1 wherein the region is formed by employing a metal tab coated with a material of the same conductivity type as the plurality of regions and alloying the tab into said one surface.

4. The method as in claim 1 including the additional step of forming a contact strip of one conductivity type to form a rectifying contact with each of said strips and ohmic contact with the region of one conductivity type.

5. The method as in claim 4 wherein said additional strip is formed by diffusion.

6. The method as in claim 4 wherein the strip is formed by alloying a metal member including a material of said one conductivity type into the face.

References Cited in the file of this patent

UNITED STATES PATENTS

| | | |
|---|---|---|
| 2,858,489 | Henkels | Oct. 28, 1958 |
| 2,861,909 | Ellis | Nov. 25, 1958 |
| 2,980,830 | Shockley | Apr. 18, 1961 |
| 2,983,631 | Hanlet | May 9, 1961 |
| 2,985,804 | Buie | May 23, 1961 |
| 2,995,473 | Levi | Aug. 8, 1961 |
| 3,001,111 | Chappey | Sept. 19, 1961 |
| 3,028,655 | Dacey et al. | Apr. 10, 1962 |